(12) United States Patent
Chen et al.

(10) Patent No.: US 8,872,037 B2
(45) Date of Patent: Oct. 28, 2014

(54) CIRCUIT BOARD ASSEMBLY WITH FLEXIBLE CIRCUIT BOARD AND REINFORCING PLATE

(71) Applicants: Hong Fu Jin Precision Industry (ShenZhen) Co., Ltd., Shenzhen (CN); Hon Hai Precision Industry Co., Ltd., New Taipei (TW)

(72) Inventors: Shin-Wen Chen, New Taipei (TW); Shu-Sheng Peng, Shenzhen (CN); Wen-Chang Chen, New Taipei (TW); Wen-Hsiung Chen, New Taipei (TW); Li-Min Liu, Shenzhen (CN); Yu-Tsan Cheng, New Taipei (TW); Yong Li, Shenzhen (CN)

(73) Assignees: Hong Fu Jin Precision Industry (ShenZhen) Co., Ltd., Shenzhen (CN); Hon Hai Precision Industry Co., Ltd., New Taipei (TW)

( * ) Notice: Subject to any disclaimer, the term of this patent is extended or adjusted under 35 U.S.C. 154(b) by 145 days.

(21) Appl. No.: 13/707,552

(22) Filed: Dec. 6, 2012

(65) Prior Publication Data
US 2014/0020934 A1     Jan. 23, 2014

(30) Foreign Application Priority Data
Jul. 20, 2012   (CN) .......................... 2012 1 02523870

(51) Int. Cl.
*H05K 1/00* (2006.01)
*H05K 1/02* (2006.01)

(52) U.S. Cl.
CPC ...... *H05K 1/0277* (2013.01); *H05K 2201/2009* (2013.01); *H05K 2201/09054* (2013.01); *H05K 1/0215* (2013.01)

USPC .......................................... 174/254; 174/255

(58) Field of Classification Search
CPC ............ H05K 1/02; H05K 1/18; H05K 1/09; H05K 1/0277; H05K 1/0215; H05K 2201/2009; H05K 2201/09054; H05K 1/0393; H05K 1/0218; H05K 2201/0715; H05K 1/189; H05K 1/118; H05K 1/14; H05K 3/4691; H05K 3/361; H05K 9/0039; H05K 1/0298; H05K 3/384; H04N 5/2257; H04N 5/335
USPC .......... 174/250–268; 361/748, 749, 760, 816, 361/818; 439/67, 77; 349/149, 150
See application file for complete search history.

(56) References Cited

U.S. PATENT DOCUMENTS

| | | | |
|---|---|---|---|
| 6,777,622 B2 * | 8/2004 | Ueno et al. ..................... | 174/262 |
| 7,132,607 B2 * | 11/2006 | Yoshimi et al. ............... | 174/255 |
| 8,058,559 B2 * | 11/2011 | Muro et al. .................... | 174/254 |
| 2014/0036116 A1 * | 2/2014 | PENG et al. .................. | 348/294 |

\* cited by examiner

*Primary Examiner* — Ishwarbhai B Patel
(74) *Attorney, Agent, or Firm* — Novak Druce Connolly Bove + Quigg LLP

(57) ABSTRACT

A circuit board assembly includes a flexible circuit board and a reinforcing plate. The flexible circuit board includes a surface. A conductive layer is positioned on the surface. The conductive layer includes a circuit portion entirely covered by a dielectric layer and a grounding portion exposed outside the dielectric layer. The reinforcing plate is mounted on the dielectric layer. The reinforcing plate includes a connection surface connected to the dielectric layer and a supporting surface facing away from the connection surface. Projections extend from the connection surface. The location of all of the projections correspond to the location of the grounding portion, and all of the projections are in electrical contact with the grounding portion by means of a conductive adhesive.

9 Claims, 3 Drawing Sheets

CIRCUIT BOARD ASSEMBLY WITH FLEXIBLE CIRCUIT BOARD AND REINFORCING PLATE

BACKGROUND

1. Technical Field

The present disclosure relates to a circuit board assembly.

2. Description of Related Art

Circuit board assemblies are widespread. A typical circuit board includes a flexible printed circuit board and a reinforcing plate. The flexible printed circuit board is mounted on the reinforcing plate by means of a conductive adhesive. Thus it achieves functions of grounding and stiffening the circuit board assembly at the same time. While in the process of bonding of the flexible circuit board and the reinforcing plate, because the flexible circuit board is multi-layer structure, this does not allow the reinforcing plate to be smoothly attached to the flexible circuit board, and the reinforcing plate and the flexible circuit board are spaced from each other.

Therefore, it is desirable to provide a circuit board assembly which can overcome the above-mentioned limitations.

BRIEF DESCRIPTION OF THE DRAWINGS

Many aspects of the present disclosure can be better understood with reference to the following drawings. The components in the drawings are not necessarily drawn to scale, the emphasis instead being placed upon clearly illustrating the principles of the present disclosure.

DETAILED DESCRIPTION

Figure 1:
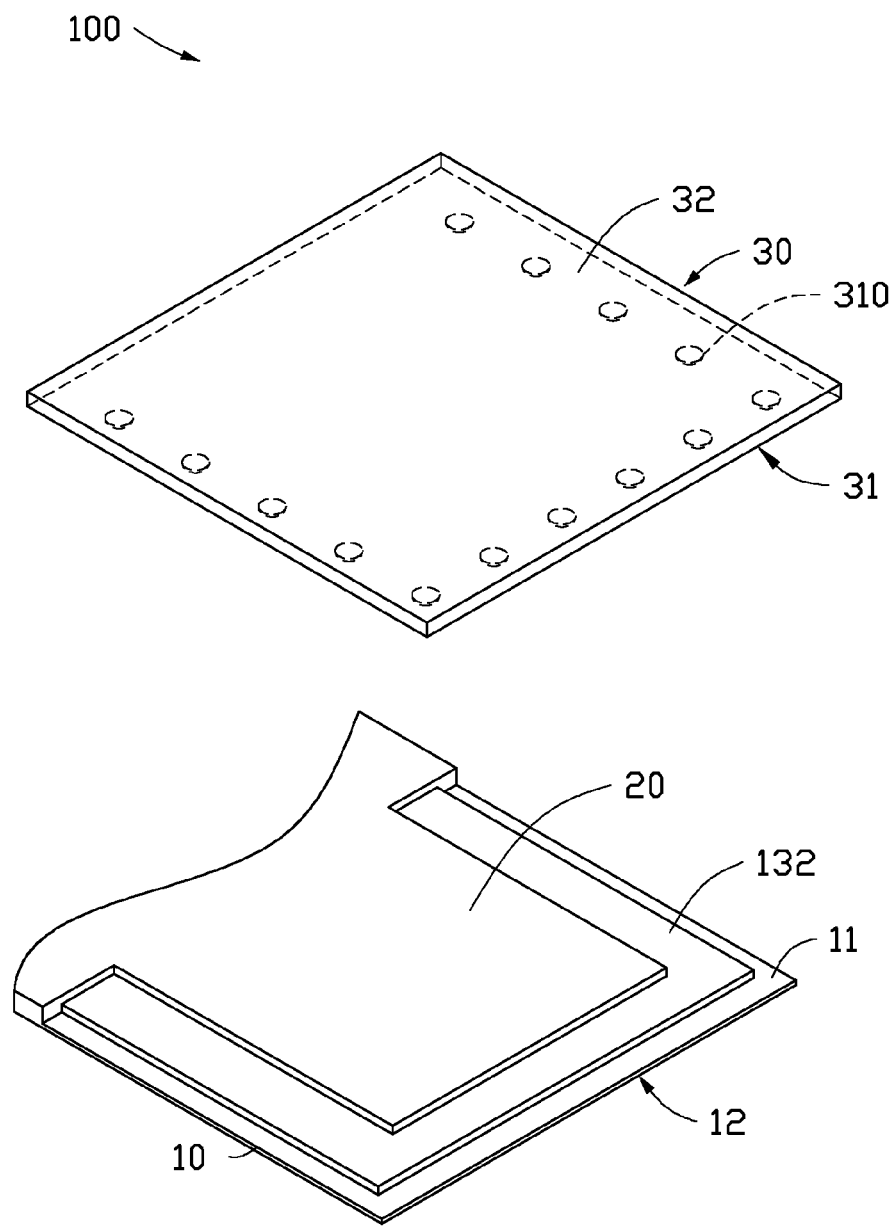
FIG. 1 is an exploded, isometric view of a circuit board assembly, according to an exemplary embodiment.
Figure 2:
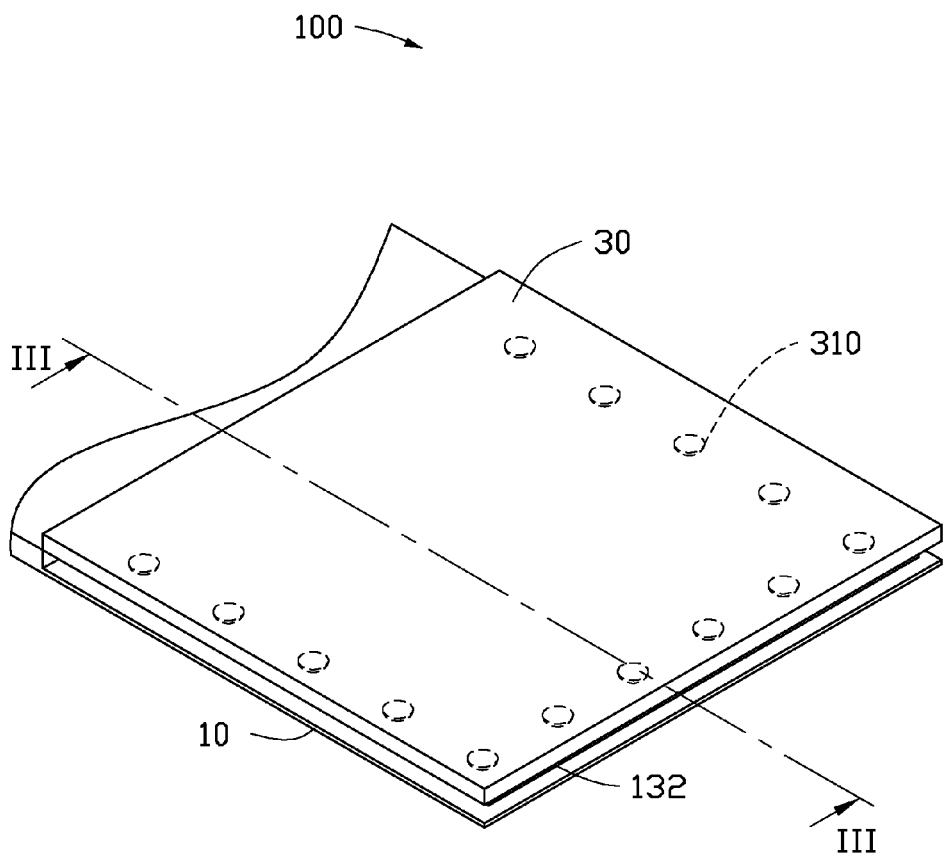
FIG. 2 is an assembled, isometric view of the circuit board assembly of FIG. 1.
Figure 3:
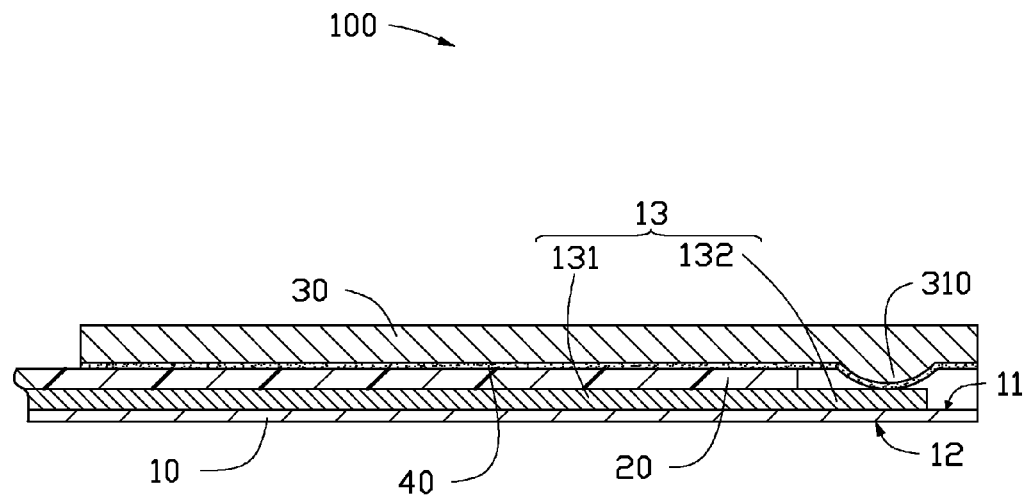
FIG. 3 is a cross-sectional view taken along line III-III of FIG. 2.

FIGS. 1-3 show a circuit board assembly 100, according to an exemplary embodiment. The circuit board assembly 100 includes a flexible circuit board 10, a dielectric layer 20, a reinforcing plate 30, and a conductive adhesive 40.

The flexible circuit board 10 includes a first surface 11 and a second surface 12 facing away from the first surface 11. A conductive layer 13 is formed on the first surface 11.

The dielectric layer 20 is made of resin and is substantially rectangular in shape. The dielectric layer 20 partially covers the conductive layer 13. The conductive layer 13 includes a circuit portion 131 entirely covered by the dielectric layer 20 and a layer available for grounding purposes (grounding portion 132) exposed outside the dielectric layer 20. In the embodiment, the grounding portion 132 as laid out is "U" shaped, and surrounds the dielectric layer 20.

In the embodiment, the reinforcing plate 30 is made of metal and is substantially rectangular in shape. The reinforcing plate 30 is mounted on the dielectric layer 20 by means of the conductive adhesive 40. The reinforcing plate 30 includes a connection surface 31 connected to the dielectric layer 20 and a supporting surface 32 facing away from the connection surface 31. A number of projections 310 perpendicularly extend from the connection surface 31. The projections 310 are integrally formed with the reinforcing plate 30. Alternatively, the projections 310 and the reinforcing plate 30 may be separately formed. The projections 310 can be attached to the connection surface 31 by adhesive, welding (e.g., plastic welding), or other attaching methods. The line of the projections 310 providing electrical connections is also "U" shaped. All of the projections 310 have essentially an identical height to promote even loading thereon. The locations of all of the projections 310 correspond to the grounding portion 132.

In the embodiment, the conductive adhesive 40 is an Anisotropic Conductive Film (ACF), which coats the connection surface 31 and entirely covers all of the projections 310. The sum of heights of one of the projections 310, the conductive adhesive 40 and the conductive layer 13 is equal to a distance between the connection surface 31 and the first surface 11, in a direction perpendicular to the first surface 11. Therefore, when the reinforcing plate 30 covers the dielectric layer 20, all of the projections 310 make contact with and electrically connect to the grounding portion 132 by means of the conductive adhesive 40.

It will be understood that the above particular embodiments are shown and described by way of illustration only. The principles and the features of the present disclosure may be employed in various and numerous embodiments thereof without departing from the scope of the disclosure as claimed. The above-described embodiments illustrate the scope of the disclosure but do not restrict the scope of the disclosure.

What is claimed is:

1. A circuit board assembly comprising:
   a flexible circuit board comprising a first surface and a second surface facing away from the first surface;
   a conductive layer positioned on the first surface, the conductive layer comprising a circuit portion and a grounding portion connected to the circuit portion;
   a dielectric layer, the circuit portion entirely covered by the dielectric layer, and the grounding portion exposed outside the dielectric layer;
   a conductive adhesive; and
   a reinforcing plate mounted on the dielectric layer, the reinforcing plate comprising a connection surface connected to the dielectric layer and a supporting surface facing away from the connection surface, the reinforcing plate comprising a plurality of projections perpendicularly extending from the connection surface, the location of all of the projections corresponding to the location of the grounding portion, all of the projections in electrical contact with the grounding portion by means of the conductive adhesive.

2. The circuit board assembly of claim 1, wherein the grounding portion is "U" shaped, and surrounds the dielectric layer.

3. The circuit board assembly of claim 2, wherein the projections are arranged in a line which is in a "U" shape.

4. The circuit board assembly of claim 1, wherein the reinforcing plate is made of metal.

5. The circuit board assembly of claim 1, wherein the plurality of projections are integrally formed with the reinforcing plate.

6. The circuit board assembly of claim 1, wherein the plurality of projections are attached to the connection surface.

7. The circuit board assembly of claim 1, wherein all of the projections have an essentially identical height.

8. The circuit board assembly of claim 7, wherein the sum of heights of each of the projections, the conductive adhesive and the conductive layer is equal to a distance between the connection surface and the first surface, in a direction perpendicular to the first surface.

9. The circuit board assembly of claim 1, wherein the conductive adhesive is an anisotropic conductive film.

* * * * *